United States Patent [19]

Kim et al.

[11] Patent Number: 5,567,642
[45] Date of Patent: Oct. 22, 1996

[54] METHOD OF FABRICATING GATE ELECTRODE OF CMOS DEVICE

[75] Inventors: Hyeon S. Kim; Choong H. Lee, both of Kyoungkido, Rep. of Korea

[73] Assignee: Hyundai Electronics Industries Co., Ltd., Kyoungkido, Rep. of Korea

[21] Appl. No.: 554,337

[22] Filed: Nov. 6, 1995

[30] Foreign Application Priority Data

Nov. 8, 1994 [FR] France ................... 94 29185

[51] Int. Cl.⁶ ................................. H01L 21/70
[52] U.S. Cl. ................. 437/57; 437/34; 437/56; 437/58; 437/186; 437/200; 148/DIG. 19; 257/369; 257/371
[58] Field of Search ................... 437/56, 34, 57, 437/58, 186, 200; 148/DIG. 19; 257/369, 371

[56] References Cited

U.S. PATENT DOCUMENTS 4,635,347  1/1987  Lien et al. ............... 148/DIG. 19
5,449,637  9/1995  Saito et al. ................... 437/34
5,480,830  1/1996  Liao et al. ................... 437/34

*Primary Examiner*—George Fourson
*Assistant Examiner*—Long Pham
*Attorney, Agent, or Firm*—Keck, Mahin & Cate

[57] ABSTRACT

A method of fabricating a gate electrode of a CMOS device is disclosed including the steps of: sequentially forming a gate insulating layer, first conductive layer and protective layer on a semiconductor substrate; selectively etching a predetermined portion of the protective layer in which a PMOS transistor will be formed; forming a second conductive layer on the overall surface of said substrate; removing the second conductive layer formed on the protective layer, and partially etching the protective layer to a predetermined thickness; and patterning the second conductive layer, the protective layer, the first conductive layer and the gate insulating layer using a gate electrode pattern.

8 Claims, 3 Drawing Sheets

1

METHOD OF FABRICATING GATE ELECTRODE OF CMOS DEVICE

BACKGROUND OF THE INVENTION

The present invention relates to a method of fabricating a gate electrode, and particularly, to a method of fabricating gate electrodes of a NMOS and a PMOS which are used to complementary metal oxide semiconductor (CMOS) device.

Generally, a CMOS is a kind of semiconductor device, which consists of a NMOS and a PMOS transistor. The gate electrodes of a NMOS and a PMOS each are formed from a material like polysilicon, silicide and polycide. The material, which forms the gate electrode, severely affects the characteristics of the CMOS device. Therefore, polycide, which has excellent electrical conductivity and stability, is mainly employed to the gate electrode.

FIG. 1 is a cross-sectional view of conventional gate electrodes of a NMOS and a PMOS transistor of a CMOS device. In this figure, reference number 1 denotes a silicon substrate, 2 a N-well, 3 a P-well, 4 a field oxide, 5 a gate oxide, 6 a polysilicon layer and 7 a silicide layer, respectively.

As shown in FIG. 1, a conventional CMOS device has a twin-tub structure. The gate electrode of this CMOS device is formed by the following process. First, the N-well 2 the and the P-well 3, having a twin-tub structure, are formed in a predetermined portion of the silicon substrate 1, and the field oxide 4 is formed on a predetermined portion of the N-well 2 and the P-well 3. Then, the gate oxide 5, the polysilicon layer 6 and the silicide layer 7 are sequentially formed on the overall surface of the substrate, and the stacks of the silicide layer, the polysilicon layer and the gate oxide are patterned to form polycide (polysilicon+silicide) gate electrodes 6 and 7.

In the conventional method for fabricating the gate electrode as described above, each gate electrode of the NMOS and the PMOS is formed of the same polycide.

However, the conventional method, in which gate electrodes of NMOS and PMOS each is formed of the same polycide, involves the following problems. That is, the silicide layer produces stress in large quantities and impurities contained in the silicide layer transfer into the gate oxide, deteriorating the characteristics of the gate oxide. This decreases the reliability and yield of the CMOS device.

It is an object of the present invention to provide a method for fabricating a gate electrode of a CMOS, in which each gate electrode of a NMOS and a PMOS is formed of polysilicon and polycide, respectively, so that the deterioration of the device caused by the silicide lager and stress is reduced, therefore, improving the reliability and yield of the CMOS device.

To accomplish the object of the present invention, there is provided a method for fabricating a gate electrode of a CMOS device, comprising the steps of: sequentially forming a gate insulating layer, a first conductive layer and a protective layer on a semiconductor substrate; selectively etching a predetermined portion of the protective layer in which a PMOS transistor will be formed; forming a second conductive layer on the overall surface of said substrate; removing the second conductive layer formed on the protective layer and partially etching the protective layer to a predetermined thickness; and patterning the second conductive layer, the protective layer, the first conductive layer and the gate insulating layer using a gate electrode pattern.

DETAILED DESCRIPTION OF THE INVENTION

A preferred embodiment of the present invention will be explained below with reference to FIGS. 2A to 2E.

In case of a CMOS device having a NMOS and a PMOS transistor, the majority carriers of the NMOS transistor are electrons and the majority carriers of the PMOS transistor are holes. Accordingly, since the mobility of holes is lower than that of electrons, the conductivity of the PMOS transistor is lower than that of the NMOS trasnsistor.

Therefore, a gate electrode of the PMOS transistor must have the structure where the conductivity is improved.

FIGS. 2A to 2E are cross-sectional views of the sequential manufacturing process of a method for fabricating a gate electrode of a CMOS having a twin-tub structure in accordance with the present invention. In this figure, reference number 11 denotes a silicon substrate, 12 a N-well, 13 a P-well, 14 a field oxide layer, 15 a gate oxide layer, 16 a polysilicon layer, 17 an oxide layer, 18 a photoresist and 19 a silicide layer, respectively.

According to the present invention, each gate electrode of the NMOS and PMOS transistor is formed of polysilicon and polycide, respectively. The carrier of the PMOS transistor is a hole and the NMOS transistor an electron. The mobility of the electron is higher than that of the hole. Therefore, the carrier mobility of the PMOS transistor is lower than that of the NMOS transistor. For this reason, polycide having excellent conductivity is employed to the gate electrode of the PMOS transistor in which the carrier mobility is low, and polysilicon, whose conductivity is lower than that of polycide but has good stability, is employed to the gate electrode of the NMOS transistor in which the carrier mobility is fine, minimizing the effect caused by the silicide layer.

Figure 1:
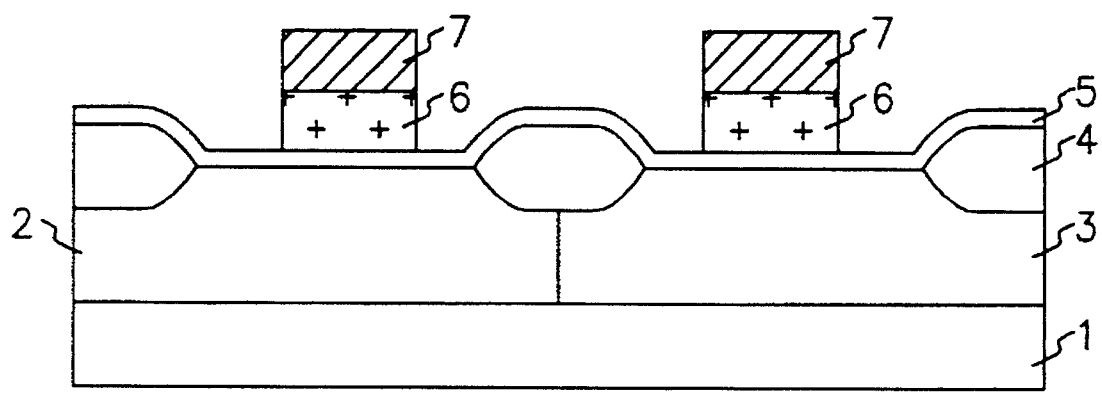
FIG. 1 is a cross-sectional view of a conventional gate electrode of a CMOS device.
Figure 2A:
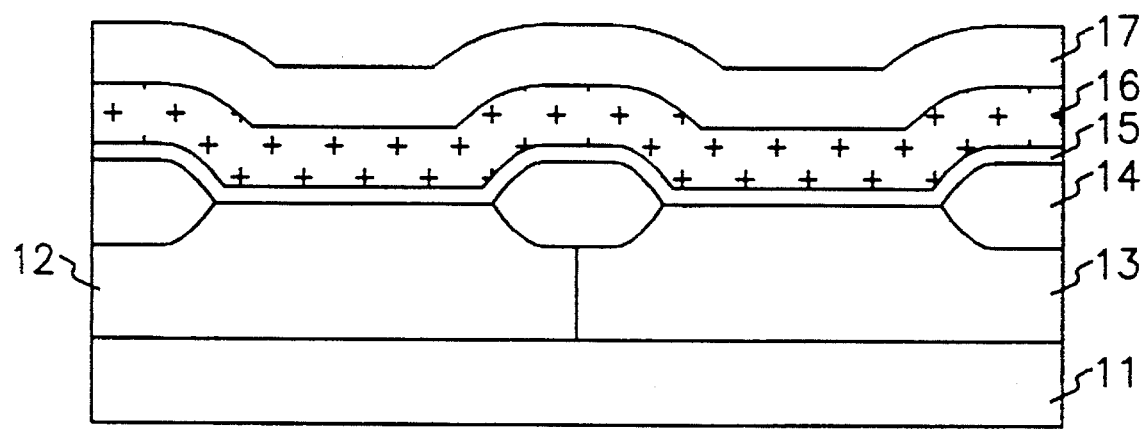
FIGS. 2A to 2E are cross-sectional views of the sequential manufacturing process of a method for fabricating a gate electrode of a CMOS according to the present invention.

First, as shown in FIG. 2A, the N-well 12 and the P-well 13 are formed in a predetermined portion of the silicon substrate 11, and the field oxide layer 14 is formed on a predetermined portion of the N-well 12 and the P-well 13. Then, the gate oxide layer 15, the polysilicon layer 16 and the oxide layer 17 are sequentially formed on the overall surface of the substrate. Here, the oxide layer 17 is formed thicker than the silicide layer which will be formed in the following process.

Figure 2B:
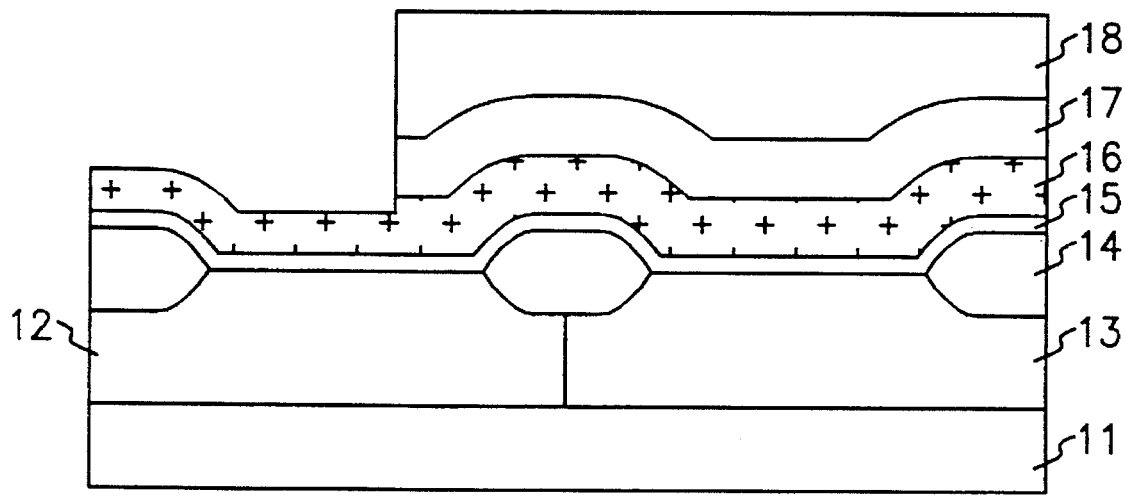

As shown in FIG. 2B, the photoresist pattern 18 is formed on the oxide layer except the portion on which the PMOS transistor will be formed (particularly, the portion on which the gate electrode will be formed). And, the exposed portion of the oxide 17 is selectively etched using the photoresist pattern 18 as a mask, and the polysilicon layer 16 is partially etched to a predetermined thickness.

Figure 2C:
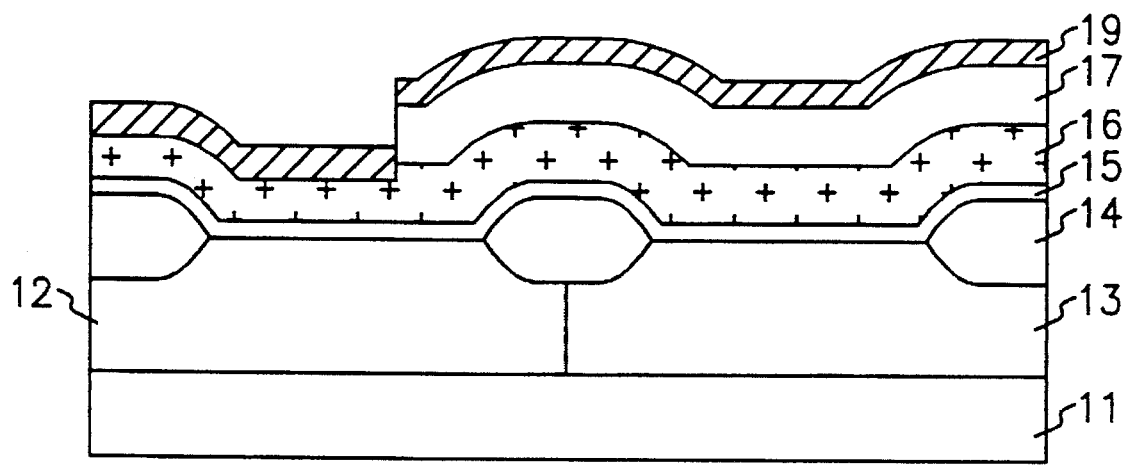

As shown in FIG. 2C, the photoresist pattern 18 is removed, and the silicide 19 is deposited on the overall surface of the substrate. At this time, the silicide 19, which is deposited on the polysilicon layer 16 of the PMOS region, is stably deposited, but the silicide 19, which is deposited on the oxide layer 17 of the NMOS region, is cracked and becomes loose due to its stress.

Figure 2D:
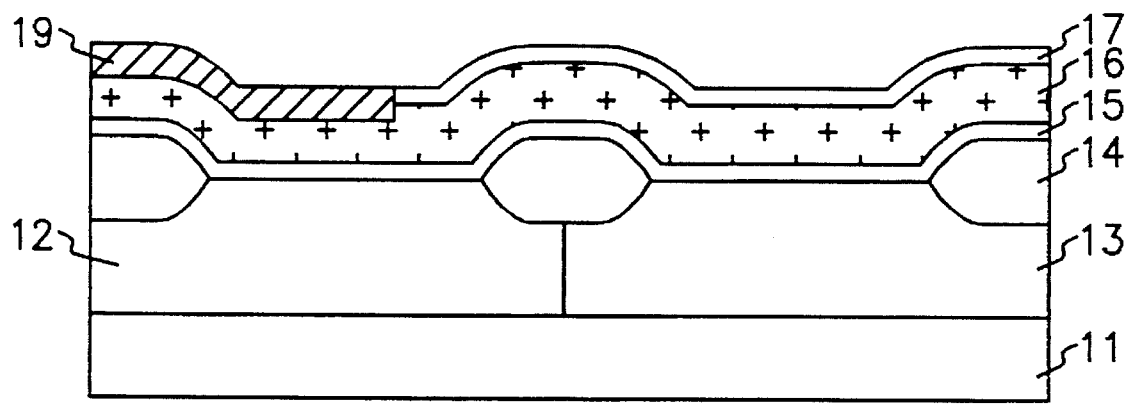

As shown in FIG. 2D, a wet etching is carried out using an oxide etchant, to remove the silicide layer 19 formed on the region in which the NMOS transistor is formed, and to partially remove the oxide layer 17 to a predetermined thickness. Here, the oxide layer 17 is left to a predetermined thickness in order to make the surface height of the oxide layer 17 same as that of the silicide layer 19, simplifying the following planarizing process.

Subsequently, phosphorus (P) and boron (B) are ion-implanted into the NMOS and PMOS transistor region, respectively, to improve the electrical conductivity of the polysilicon layer 16.

Figure 2E:
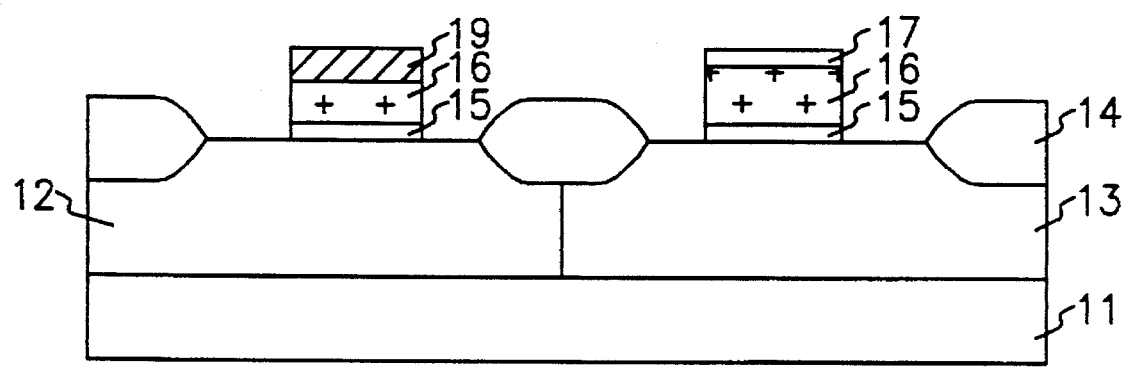

As shown in FIG. 2E, the stacks of the silicide layer 19, the oxide layer 17, the polysilicon layer 16 and the gate oxide layer 15 are patterned using a gate electrode pattern, to form the gate electrodes.

Therefore, a polycide gate electrode having excellent conductivity is formed on the PMOS transistor region in which the carrier mobility is low, and a polysilicon gate electrode, whose conductivity is lower than that of polycide but having good stability, is formed on the NMOS transistor region in which the carrier mobility is fine, minimizing the effect caused by the silicide layer.

Meanwhile, the oxide layer 17 is partially left to a predetermined thickness as described above, or is removed all together. In case where the oxide layer is totally removed, the polysilicon layer 16 is removed more than the case where the oxide layer is partially left. This simplifies the following planarizing process.

Since the gate electrode of the PMOS transistor has a policide structure, the operating speed of the NMOS and PMOS transistors may be all the same in the CMOS process.

In the present invention as described above, each gate electrode of the NMOS and PMOS transistor is formed of polysilicon and polycide, respectively, reducing the deterioration of the device and stress caused by the silicide layer. This improves the reliability and yield of the CMOS device.

What is claimed is:

1. A method of fabricating a gate electrode of a CMOS device, comprising the steps of:

sequentially forming a gate insulating layer, a first conductive layer and a protective layer on a semiconductor substrate;

selectively etching a portion of said protective layer in which a PMOS transistor is formed;

forming a second conductive layer on a resulting surface of said substrate;

removing said second conductive layer formed on said protective layer, and partially etching said protective layer to a first thickness; and patterning said second conductive layer, said protective layer, said first conductive layer and said gate insulating layer to form a gate electrode.

2. The method of fabricating a gate electrode of a CMOS device as claimed in claim 1, wherein said first conductive layer is formed of polysilicon.

3. The method of fabricating a gate electrode of a CMOS device as claimed in claim 1, wherein said second conductive layer is formed of silicide.

4. The method of fabricating a gate electrode of a CMOS device as claimed in claim 1, after the step of selectively etching a portion of said protective layer, further comprising the step of:

partially etching an exposed portion of said first conductive layer to a second thickness.

5. The method of fabricating a gate electrode of a CMOS device as claimed in claim 1, wherein said protective layer is partially removed to a first thickness so as to make surface heights of said protective layer and said second conductive layer same.

6. The method of fabricating a gate electrode of a CMOS device as claimed in claim 1, after the step of partially etching said protective layer to a first determined thickness, further comprising the step of:

ion-implanting a V-group impurity and III-group impurity into NMOS and PMOS transistor regions, respectively.

7. The method of fabricating a gate electrode of a CMOS device as claimed in claim 1, wherein said protective layer is formed thicker than said second conductive layer.

8. The method of fabricating a gate electrode of a CMOS device as claimed in claim 1, wherein said second conductive layer formed on said protective layer and said protective layer are removed using an etchant.

* * * * *